US012723308B2

(12) United States Patent
Quick et al.

(10) Patent No.: US 12,723,308 B2
(45) Date of Patent: Sep. 1, 2026

(54) FORMING AN INDIUM CHALCOGENIDE FILM

(71) Applicant: Micron Technology, Inc., Boise, ID (US)

(72) Inventors: Timothy A. Quick, Boise, ID (US); Jean-Sebastien Materne Lehn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 18/789,244

(22) Filed: Jul. 30, 2024

(65) Prior Publication Data

US 2025/0320600 A1 Oct. 16, 2025

Related U.S. Application Data

(60) Provisional application No. 63/633,590, filed on Apr. 12, 2024.

(51) Int. Cl.
*C23C 16/30* (2006.01)
*C23C 16/44* (2006.01)
*C23C 16/455* (2006.01)

(52) U.S. Cl.
CPC ........ *C23C 16/305* (2013.01); *C23C 16/4408* (2013.01); *C23C 16/45553* (2013.01)

(58) Field of Classification Search
CPC .............. C23C 16/305; C23C 16/4408; C23C 16/45553; C23C 16/045; C23C 16/45534
See application file for complete search history.

(56) References Cited

U.S. PATENT DOCUMENTS

2011/0017283 A1 1/2011 Kampmann et al.
2014/0024173 A1* 1/2014 Xiao ....................... H10F 77/12 438/102
2020/0058870 A1* 2/2020 Lee ...................... H10N 70/826
2022/0033966 A1* 2/2022 Bruneau ........... C23C 16/45531
2023/0357281 A1 11/2023 Diemoz et al.

FOREIGN PATENT DOCUMENTS

EP 2278625 A1 1/2011
KR 10-2023-0074580 A 5/2023

OTHER PUBLICATIONS

"International Search Report and Written Opinion of the International Searching Authority," issued in connection with Int'l Appl. No. PCT/US2025/022809, dated Jul. 16, 2025 (13 pages).

* cited by examiner

*Primary Examiner* — Michael G Miller
(74) *Attorney, Agent, or Firm* — Holland & Hart LLP

(57) ABSTRACT

Methods, systems, and devices for forming an indium chalcogenide film are described. Precursors that include an indium-cyclopentadienyl compound may enable formation of indium chalcogenide films at a lower temperature as compared to other precursors including indium, as the reactivity of indium-cyclopentadienyl compounds may be higher than these other precursors. Additionally, using ammonia as a reagent during the atomic layer deposition process to form the indium chalcogenide film may enable an increased rate of formation of indium chalcogenide films for a given temperature. A method may include reacting an indium-cyclopentadienyl precursor and a second precursor that includes a selenium compound or a tellurium compound to form an indium chalcogenide.

30 Claims, 7 Drawing Sheets

300

Figure 4:
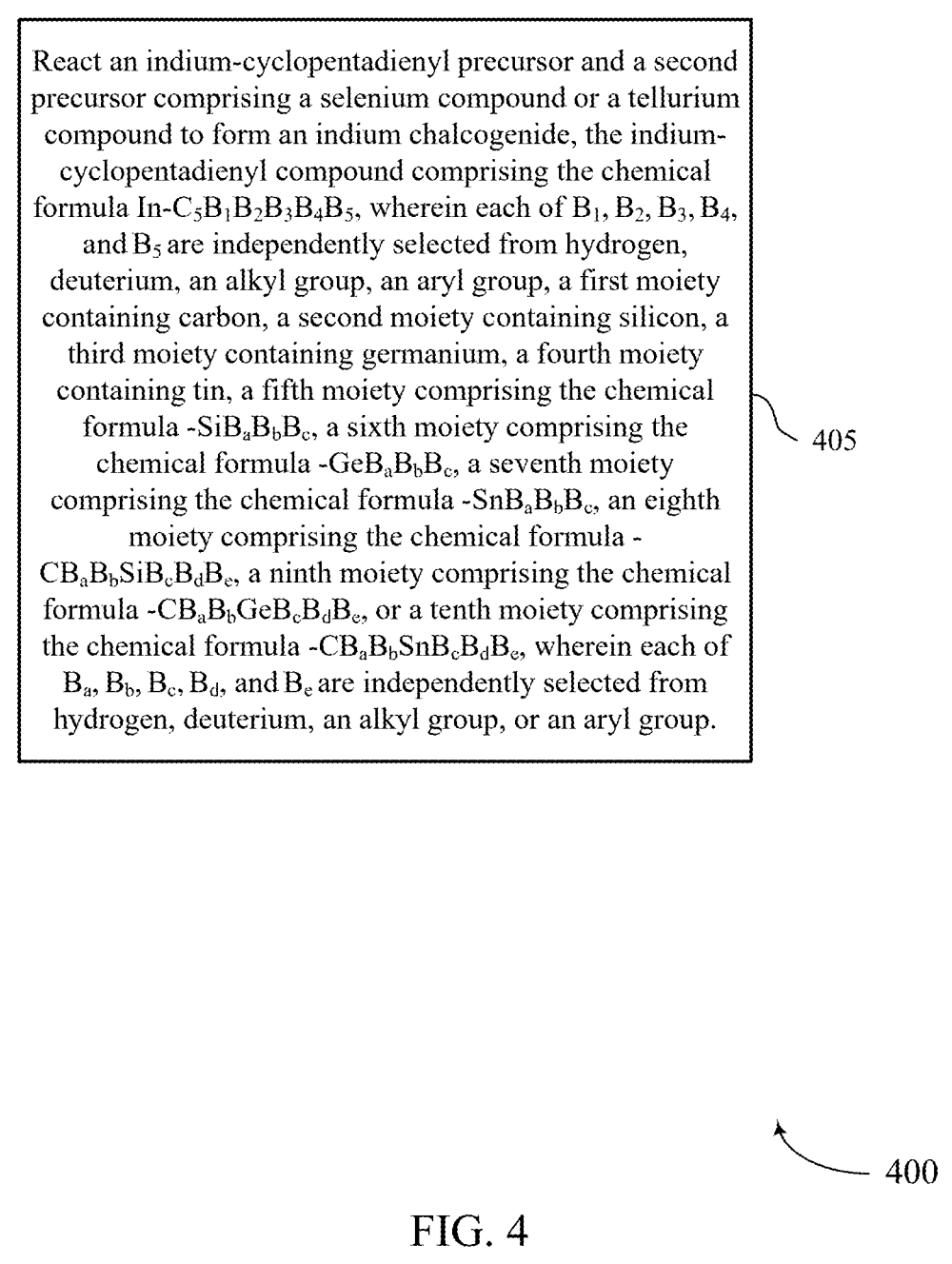

React an indium-cyclopentadienyl precursor and a second precursor comprising a selenium compound or a tellurium compound to form an indium chalcogenide, the indium-cyclopentadienyl compound comprising the chemical formula $In\text{-}C_5B_1B_2B_3B_4B_5$, wherein each of $B_1$, $B_2$, $B_3$, $B_4$, and $B_5$ are independently selected from hydrogen, deuterium, an alkyl group, an aryl group, a first moiety containing carbon, a second moiety containing silicon, a third moiety containing germanium, a fourth moiety containing tin, a fifth moiety comprising the chemical formula $-SiB_aB_bB_c$, a sixth moiety comprising the chemical formula $-GeB_aB_bB_c$, a seventh moiety comprising the chemical formula $-SnB_aB_bB_c$, an eighth moiety comprising the chemical formula $-CB_aB_bSiB_cB_dB_e$, a ninth moiety comprising the chemical formula $-CB_aB_bGeB_cB_dB_e$, or a tenth moiety comprising the chemical formula $-CB_aB_bSnB_cB_dB_e$, wherein each of $B_a$, $B_b$, $B_c$, $B_d$, and $B_e$ are independently selected from hydrogen, deuterium, an alkyl group, or an aryl group.

FORMING AN INDIUM CHALCOGENIDE FILM

CROSS REFERENCE

The present Application for Patent claims priority to U.S. Patent Application No. 63/633,590 by Quick et al., entitled "FORMING AN INDIUM CHALCOGENIDE FILM," filed Apr. 12, 2024, which is assigned to the assignee hereof, and which is expressly incorporated by reference in its entirety herein.

TECHNICAL FIELD

The following relates to one or more systems for memory, including forming an indium chalcogenide film.

BACKGROUND

Atomic layer deposition (ALD) is a technique used to deposit a film on a first material. For instance, performing ALD may include exposing the first material to a first precursor to form a second material on the first material. Additionally, performing ALD may include exposing the second material to a second precursor, where the second precursor may react with the second material to leave a third material on the surface of the first material. In some examples, the process may repeat, where the third material may be exposed to the first precursor to form another instance of the second material on the third material, and then the other instance of the second material may be exposed to the second precursor to leave another instance of the third material on the surface of the previously formed instance of the third material.

In some examples, reactions involved in ALD may occur at various temperatures. However, if such temperatures are outside of a defined range for a threshold duration, other materials in a vicinity to the material being exposed to ALD may experience a change in physical or chemical properties beyond an expected threshold. Such changes in physical or chemical properties may adversely affect an operation of an electronic device that includes these other materials (e.g., may decrease a lifetime of the electronic device, may increase a likelihood that the electronic device displays errant behavior or does not perform its intended function). For some materials, the temperature to facilitate reactions (e.g., for forming the third material) in ALD may exceed the defined range for the threshold duration. Accordingly, materials whose reactions may be facilitated to be within the defined range or to be outside of the defined range for less than the defined duration, may decrease a likelihood that the operation of the electronic device is adversely affected.

BRIEF DESCRIPTION OF THE DRAWINGS

FIGS. 4 through 7 show flowcharts illustrating methods that support forming an indium chalcogenide film in accordance with examples as disclosed herein.

DETAILED DESCRIPTION

Figure 1:
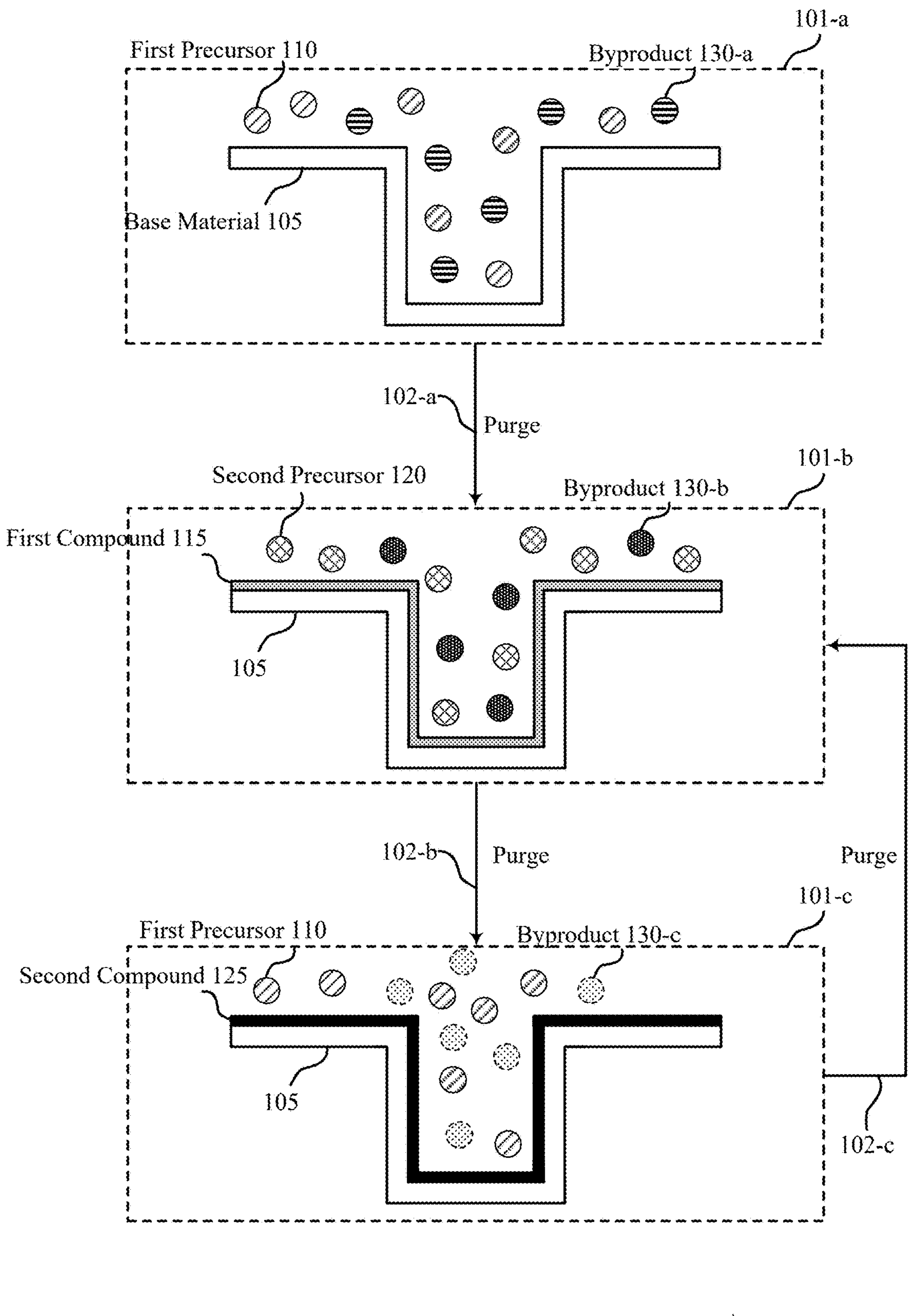
FIG. 1 shows an example of an atomic layer deposition (ALD) process that supports forming an indium chalcogenide film in accordance with examples as disclosed herein.

In some examples, an indium chalcogenide film, such as an indium selenium film, an indium tellurium film, or both may be deposited on a material using a deposition technique such as an atomic layer deposition (ALD) or chemical vapor deposition (CVD). However, in some processes for forming the indium chalcogenide, the ambient temperature may be set with a high enough value such that physical or chemical characteristics of other materials in the same vicinity as the material may be adversely affected. For instance, the electronic device may be more likely to display errant behavior or may not perform its intended function due to a change in the physical or chemical properties of such materials. Accordingly, precursors capable of forming the indium chalcogenide film at a lower temperature may decrease a likelihood that the operation of the electronic device is adversely affected.

As described in the present disclosure, precursors that include an indium-cyclopentadienyl compound may enable formation of indium chalcogenide films at a lower temperature as compared to other precursors including indium, as the reactivity of indium-cyclopentadienyl compounds may be higher than these other precursors. Additionally, using ammonia (NH3) as a reagent during an ALD process to form the indium chalcogenide film may enable an increased rate of formation of indium chalcogenide films for a given temperature. In one example of the methods disclosed herein, the method may include reacting an indium-cyclopentadienyl precursor and a second precursor that includes a selenium compound or a tellurium compound to form an indium chalcogenide.

In addition to applicability in memory systems as described herein, techniques for forming an indium chalcogenide film may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by supporting improved material properties of memory cells, which may decrease processing or latency times, improve response times, or otherwise improve user experience, among other benefits.

Features of the disclosure are initially described in the context of an ALD process and a material formation process as described with reference to FIGS. 1 and 2. Features of the disclosure are described in the context of an electronic device as described with reference to FIG. 3. These and other features of the disclosure are further illustrated by and described with reference to flowcharts that relate to methods for depositing carbon conducting films by atomic layer deposition as described with reference to FIGS. 4 through 7.

FIG. 1 illustrates an example of an ALD process 100 that supports methods for forming an indium chalcogenide film in accordance with examples as disclosed herein.

As illustrated in stage 101-*a*, a base material 105 may be exposed to a first precursor 110. For instance, the base material 105 may be located in a reactor (e.g., deposition chamber) within which a gaseous phase of the first precursor 110 may be introduced. Exposing the base material to the first precursor may enable a first compound 115 to form on the surface of the base material 105, as depicted in stage 101-*b*. In some examples, as a result of the reaction between base material 105 and first precursor 110, a byproduct 130-*a* will be formed. In that case, the byproduct 130-*a* and/or a portion of the first precursor 110 may be purged (e.g., removed from the reactor) at 102-*a* before proceeding to stage 101-*b*. In some examples, the temperature of the reactor may be set or adjusted to a first predefined value such that the first compound 115 forms on the surface of the base material 105. In some examples, the base material may be a substrate. In some examples, exposing a material to a precursor may refer to adding the precursor to the reactor within which the material is located, whereas reacting the material with the precursor may refer to a chemical reaction that occurs between the precursor and the material and may involve setting or adjusting a temperature of the reactor to a particular temperature that facilitates the reaction.

After forming the first compound 115 at stage 101-*a*, the first compound 115 may be exposed to a second precursor 120 at stage 101-*b*. For instance, a gaseous phase of the second precursor 120 may be introduced into the reactor and exposed to the surface of the first compound 115. In some examples, the base material 105 may be transported to a second reactor for introducing the second precursor 120. In other examples, the same reactor may be used. The second precursor 120 may react with the first compound 115 to form a second compound 125, as shown in stage 101-*b*. In some examples, as a result of the reaction between first compound 115 and second precursor 120, a byproduct 130-*b* will be formed. After forming second compound 125, the byproduct 130-*b* and/or at least a portion of the second precursor 120 may be purged (e.g., removed from the reactor) at 102-*b* before proceeding to stage 101-*c*. In some examples, the temperature of the reactor may be set or adjusted to a second predefined value such that the second compound 125 forms on the surface of the base material 105.

After forming the second compound 125 at stage 101-*b*, the second compound 125 may be exposed to a first precursor 110 at stage 101-*c*. For instance, a gaseous phase of the first precursor 110 may be introduced to the reactor and exposed to the surface of the second compound 125. In some examples, the base material 105 may be transported to a third reactor for introducing the first precursor 110. In other examples, the same reactor may be used for stage 101-*c* as used for one or both of stages 101-*a* and 101-*b*. The first precursor 110 may react with the second compound 125 to form a second instance of the first compound 115 on top of the second compound 125. In some examples, as a result of the reaction between second compound 125 and first precursor 110, a byproduct 130-*c* will be formed. After forming the second instance of first compound 115, the byproduct 130-*c* and/or at least a portion of the first precursor 110 may be purged (e.g., removed from the reactor) at 102-*c* before returning back to stage 101-*b*. In some examples, the temperature of the reactor may be set or adjusted to the first predefined value or a third predefined value such that the first compound 115 forms on the surface of the base material 105. In some examples, first precursor 110 and second precursor 120 may be delivered to the reactor (e.g., or reactors) using an inert gas (e.g., argon, helium, nitrogen). Additionally or alternatively, the byproducts 130-*a*, 130-*b* and/or 130-*c* may be purged using an inert gas (e.g., argon, helium, nitrogen).

In some examples, the process may be repeated to deposit multiple layers of the second compound 125. For instance, after depositing a first instance of second compound 125, the first instance of the second compound 125 may be exposed to the first precursor 110 to form a second instance of the first compound 115 on a surface of the first instance of the second compound 125. Then, the second instance of the first compound 115 may be exposed to the second precursor 120 to form a second instance of the second compound 125 on the surface of the first instance of the second compound 125.

In some examples, the first precursor 110 may include at least one indium-containing molecule and may be defined as the chemical formula In—Cp, where Cp may be defined as $C_5B_1B_2B_3B_4B_5$, where each of $B_1$, $B_2$, $B_3$, $B_4$, and $B_5$ may be independently selected from hydrogen, deuterium, an alkyl group, an aryl group, or a combination thereof.

Additionally, or alternatively, each of $B_1$, $B_2$, $B_3$, $B_4$, and $B_5$ may be independently selected from a $—SiB_aB_bB_c$ moiety, a $—GeB_aB_bB_c$ moiety, a $—SnB_aB_bB_c$ moiety, a $—SiB_aB_bCB_cB_dB_e$ moiety, a $—CB_aB_bSiB_cB_dB_e$ moiety, a $—SiB_aB_bGeB_cB_dB_e$ moiety, a $—CB_aB_bGeB_cB_dB_e$ moiety, a $—CB_aB_bSnB_cB_dB_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

In some examples, the second precursor 120 may include at least one selenium-containing molecule and may be defined as the chemical formula $R_1R_2R_3A\text{-}Se—ZR_4R_5R_6$, where A or Z may be independently selected from germanium, tin, or silicon, where Se represents a selenium atom, and where each of $R_1$, $R_2$, $R_3$, $R_4$, $R_5$, and $R_6$ may be independently selected from hydrogen, deuterium, an alkyl group, an aryl group, or a combination thereof.

Additionally, or alternatively, each of $R_1$, $R_2$, $R_3$, $R_4$, $R_5$, and $R_6$ may be independently selected from a $—SiR_aR_bR_e$ moiety, a $—GeR_aR_bR_e$ moiety, a $—SnR_aR_bR_e$ moiety, a $—SR_aR_bCR_eR_dR_e$ moiety, a $—CR_aR_bSiR_cR_dR_e$ moiety, a $—SiR_aR_bGeR_cR_dR_e$ moiety, a $—CR_aR_bGeR_cR_dR_e$ moiety, a $—CR_aR_bSnR_cR_dR_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin)

atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

In some examples, the second precursor 120 may include at least one tellurium-containing molecule and may be defined as the chemical formula $R_1R_2R_3A\text{-Te—}ZR_4R_5R_6$, where A or Z may be independently selected from germanium, tin, or silicon, where Te represents a tellurium atom, and where each of $R_1$, $R_2$, $R_3$, $R_4$, $R_5$, and $R_6$ may be independently selected from hydrogen, deuterium, an alkyl group, an aryl group, or a combination thereof.

Additionally, or alternatively, each of $R_1$, $R_2$, $R_3$, $R_4$, $R_5$, and $R_6$ may be independently selected from a $—SR_aR_bR_c$ moiety, a $—GeR_aR_bR_e$ moiety, a $—SnR_aR_bR_e$ moiety, a $—SR_aR_bCR_cR_dR_e$ moiety, a $—CR_aR_bSiR_cR_dR_e$ moiety, a $—SiR_aR_bGeR_cR_dR_e$ moiety, a $—CR_aR_bGeR_cR_dR_e$ moiety, a $—CR_aR_bSnR_cR_dR_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen (or deuterium), an alkyl group, an aryl group, or a combination thereof.

In some examples, the base material 105 may be a structure on a substrate (e.g., a wafer). In some such examples, the base material 105 may span in a first direction and a second direction, where the first direction is orthogonal to the second direction. Additionally, a memory device including the base material 105 may include word lines extending along the first direction and/or the second direction and bit lines extending along a third direction orthogonal to the first direction and the second direction. The techniques as described herein may include forming the structure, which may include forming a stack of layers of a first material and a second material over the substrate. The techniques may further include forming one or more word lines in the stack of materials using a metallization process. The techniques may further include forming one or more memory cells in the stack of materials, each memory cell of the one or more memory cells coupled between a respective word line of the one or more word lines and a respective conductive pillar of one or more conductive pillars. In some such examples, forming the memory cells may include forming a second stack of materials (e.g., a sequence of materials) in one or more recesses of the word lines, where the second stack may extend along the first direction and/or the second direction and where the sequence of materials may include a memory cell (e.g., a chalcogenide element) that includes the indium chalcogenide film. In some examples, the techniques described herein may be used to form a compound on the base material 105, the word lines, the bit lines, the stacks, or any combination thereof.

In some examples, the ALD process 100 may include exposing the first compound 115, the second compound 125, or both to ammonia. For example, before the stage 101-*b* and after the stage 101-*a* (e.g., between the stages 101-*a* and 101-*b*), the ALD process 100 may include introducing ammonia (e.g., a gaseous phase of ammonia) into the reactor and exposed to the surface of the first compound 115. In some examples, the base material 105 may be transported to a second reactor for introducing ammonia. In other examples, the same reactor may be used. Additionally, or alternatively, introducing the ammonia and introducing the second compound may at least partially overlap in time. For example, after the stage 101-*b*, the ammonia and the selenium compound may be co-flowed (e.g., flowed into the chamber) simultaneously. In some cases, such a step may be followed by removing the excess ammonia, selenium compound, and reaction byproducts using, for example, an evacuation, and argon purge, or a combination thereof. Introducing ammonia to the ALD process 100 may support increased reactivity between the first precursor 110 and the second precursor 120, which may result in an increased growth rate of the first compound 115, the second compound 125, or both for each cycle of the ALD process 100 at various temperatures. For example, TABLE 1 illustrates the proportion of the first precursor 110 and the second precursor 120 in the final indium chalcogenide film, expressed as percentages, the growth rate of the ALD process, expressed as Angstroms per cycles (A/cycle), and the density of the indium chalcogenide film, expressed as grams per cubic centimeter (g/cm$^3$) at various deposition temperatures, express in degrees Celsius (C°) using an ALD process 100 that includes introducing ammonia between stages 101-*a* and 101-*b*.

TABLE 1

| Deposition Temperature (C. °) | First Precursor Percent | Second Precursor Percent | Growth Rate (A/cycle) | Film Density (g/cm$^3$) |
|---|---|---|---|---|
| 90 | 50 | 50 | 0.64 | 5.7 |
| 100 | 50 | 50 | 0.58 | 5.7 |
| 115 | 48 | 52 | 0.44 | 5.7 |
| 125 | 47 | 53 | 0.36 | 5.6 |
| 150 | 45 | 55 | 0.22 | 5.6 |

In some examples, the stages 101-*a*, 101-*b*, and 101-*c* and the purging at 102-*a* and 102-*b* may be performed at selected temperatures, pressures, and for selected durations to support forming the indium chalcogenide film. By way of non-limiting example, the ALD process 100 may be performed at a temperature between 90 degrees Celsius and 150 degrees Celsius and at or near a pressure of between 0.5 torr and 20 torr. Additionally, depositing the first precursor 110 (e.g., at stage 101-*a*, at stage 101-*c*), depositing the second precursor 120 (e.g., at stage 101-*b*) may include exposing the first precursor 110 and the second precursor 120, respectively, for a first duration (e.g., 10 seconds). In some examples, depositing the ammonia may include exposing the ammonia for the first duration. The purging performed at 102-*a* and 102-*b* may be performed for a second duration less than the first duration (e.g., 5 seconds). However, one skilled in the art may recognize that such values are exemplary, and similar results may be obtained using alternate values.

In some examples, the reacting at 101-*a* through 101-*c* may occur at lower temperatures, relative to other deposition processes to form indium chalcogenide films. For example, the first precursor 110 reacting with the second precursor 120 (e.g., the indium compound reacting with the selenium compound, the indium compound reacting with the tellurium compound) may enable reactivity (e.g., the reacting at 101-*a* through 101-*c*) at temperatures between 90 degrees Celsius and 150 degrees Celsius. Alternatively, other methods to form indium chalcogenide films, such as pressure vapor deposition (PVD) may occur at higher temperatures. Accordingly, forming an indium chalcogenide film using the ALD process 100 may allow conformally depositing the indium chalcogenide film on or in high aspect-ratio structures. Such high aspect-ratio structures may be examples of various stages of memory system manufacturing, and forming the indium chalcogenide film may include depositing the indium chalcogenide film in recesses of the structure, for example as part of a memory cell material.

Figure 2:
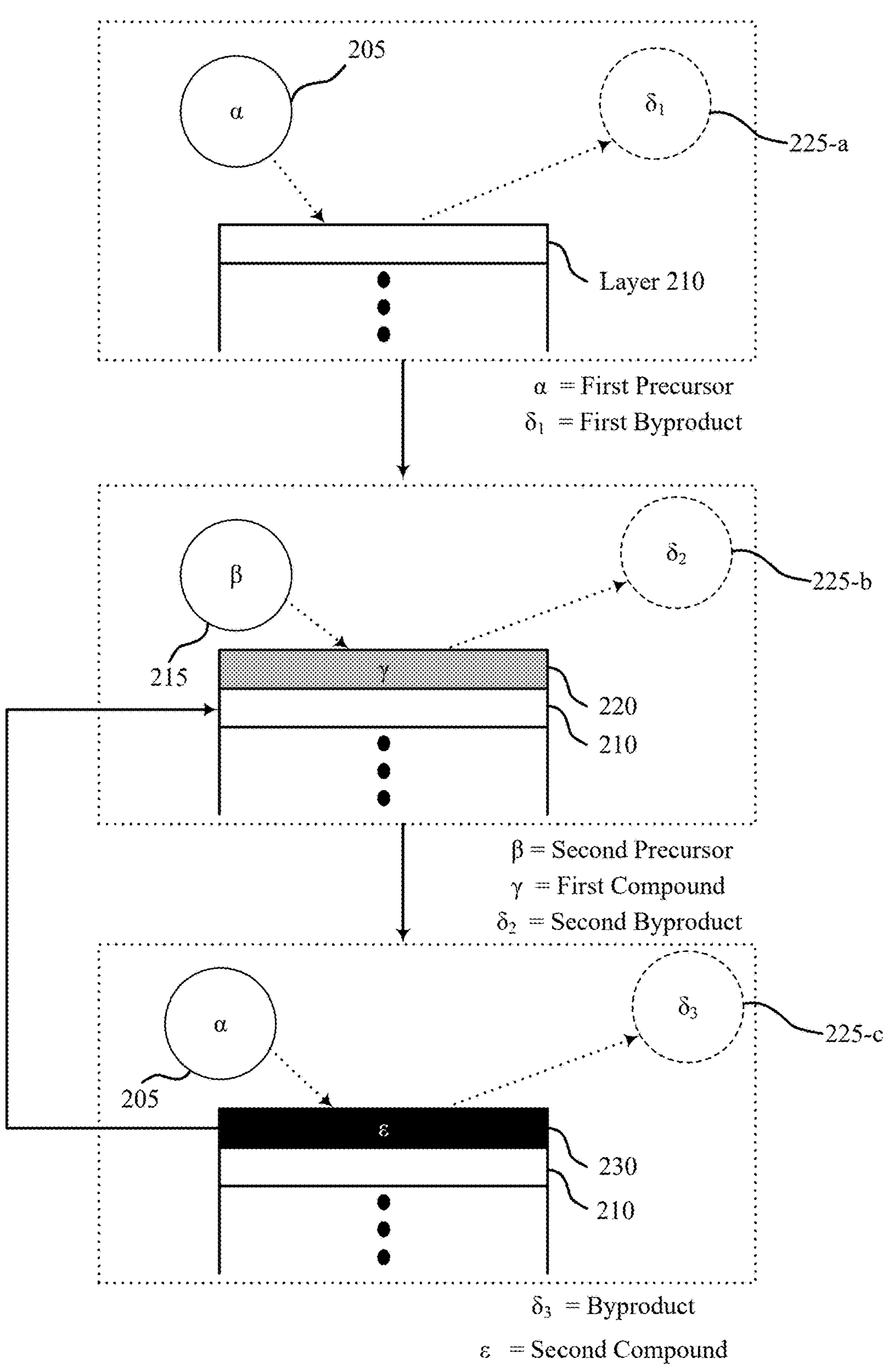
FIG. 2 shows an example of a material formation process that supports forming an indium chalcogenide film in accordance with examples as disclosed herein.

FIG. 2 illustrates an example of a material deposition process 200 that supports forming an indium chalcogenide film in accordance with examples as disclosed herein.

As illustrated in FIG. 2, a layer 210 may be exposed to a first precursor 205. The first precursor 205, for instance, may include at least one indium-containing molecule and may be defined as the chemical formula In—Cp, where Cp may be defined as $C_5B_1B_2B_3B_4B_5$, where each of $B_1$, $B_2$, $B_3$, $B_4$, and $B_5$ may be independently selected from hydrogen, deuterium, an alkyl group, an aryl group, or a combination thereof.

Additionally, or alternatively, each of $B_1$, $B_2$, $B_3$, $B_4$, and $B_5$ may be independently selected from a $—SiB_aB_bB_c$ moiety, a $—GeB_aB_bB_c$ moiety, a $—SnB_aB_bB_c$ moiety, a $—SiB_aB_bCB_cB_dB_e$ moiety, a $—CB_aB_bSiB_cB_dB_e$ moiety, a $—SiB_aB_bGeB_cB_dB_e$ moiety, a $—CB_aB_bGeB_cB_dB_e$ moiety, a $—CB_aB_bSnB_cB_dB_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

In some examples, the first precursor 205 reacting with the layer 210 may form a byproduct 225-*a*, which may be removed from the reactor. After forming the first compound 220, the first compound 220 may be exposed to a second precursor 215. The second precursor 215 may react with the first compound 220 to form second compound 230. In some examples, the second precursor 215 may form a layer on the first compound 220 and the layer may react with the first compound 220 to form the second compound 230. In other examples, the second precursor 215 may directly react with the first compound 220 to form the second compound 230. This reaction may produce a byproduct 225-*b*, which may be removed from the reactor. In some examples, the first compound may be an indium compound.

In some examples, the second compound 230 may be exposed to a first precursor 205 to form a second instance of the first compound on the second compound 230. In some examples, the first precursor may form a layer on the second compound 230 and the layer may react with the second compound 230 to form the second instance of the first compound. In other examples, the first precursor 205 may directly react with the second compound 230 to form the second instance of the first compound. This reaction may produce a byproduct 225-*c*, which may be removed from the reactor. Without deviating from the scope of the disclosure, the second instance of the first compound may instead be a third compound distinct from the first compound. In some examples, the process may be repeated to deposit multiple layers of the second compound 230. For instance, the process may repeat again where the second instance of the first compound acts as depicted first compound 220 and second compound 230 acts as layer 210. In some examples, first precursor 205 and second precursor 215 may be delivered to the reactor (e.g., or reactors) using an inert gas (e.g., argon, helium, nitrogen). Additionally or alternatively, the byproducts 225-*a*, 225-*b*, and/or 225-*c* may be purged using an inert gas (e.g., argon, helium, nitrogen). In some examples, exposing the layer 210 to the first precursor 205 reacting the second precursor 215 with the first compound 220, performing the exposure to the first precursor 205 to form a second instance of instance of the first compound on the second compound 230, or any combination thereof may be performed at temperatures between 90 degrees Celsius and 150 degrees Celsius.

In some examples, the second precursor 215 may include at least one selenium-containing molecule and may be defined as the chemical formula $R_1R_2R_3A$-Se—$ZR_4R_5R_6$, where A or Z may be independently selected from germanium, tin, or silicon, where Se represents a selenium atom, and where each of $R_1$, $R_2$, $R_3$, $R_4$, $R_5$, and $R_6$ may be independently selected from hydrogen, deuterium, an alkyl group, an aryl group, or a combination thereof.

Additionally, or alternatively, each of $R_1$, $R_2$, $R_3$, $R_4$, $R_5$, and $R_6$ may be independently selected from a $—SiR_aR_bR_e$ moiety, a $—GeR_aR_bR_e$ moiety, a $—SnR_aR_bR_e$ moiety, a $—SR_aR_bCR_eR_dR_e$ moiety, a $—CR_aR_bSiR_cR_dR_e$ moiety, a $—SiR_aR_bGeR_cR_dR_e$ moiety, a $—CR_aR_bGeR_cR_dR_e$ moiety, a $—CR_aR_bSnR_cR_dR_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

In some examples, the second precursor 215 may include at least one tellurium-containing molecule and may be defined as the chemical formula $R_1R_2R_3A\text{-Te—}ZR_4R_5R_6$, where A or Z may be independently selected from germanium, tin, or silicon, where Te represents a tellurium atom, and where each of $R_1$, $R_2$, $R_3$, $R_4$, $R_5$, and $R_6$ may be independently selected from hydrogen, deuterium, an alkyl group, an aryl group, or a combination thereof.

Additionally, or alternatively, each of $R_1$, $R_2$, $R_3$, $R_4$, $R_5$, and $R_6$ may be independently selected from a $—SiR_aR_bR_c$ moiety, a $—GeR_aR_bR_c$ moiety, a $—SnR_aR_bR_c$ moiety, a $—SR_aR_bCR_cR_dR_e$ moiety, a $—CR_aR_bSiR_cR_dR_e$ moiety, a $—SiR_aR_bGeR_cR_dR_e$ moiety, a $—CR_aR_bGeR_cR_dR_e$ moiety, a $—CR_aR_bSnR_cR_dR_e$ moiety, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen (or deuterium), an alkyl group, an aryl group, or a combination thereof.

In some examples, the material deposition process 200 may include exposing the layer 210, the compound 220, the compound 230, or a combination thereof to ammonia. For example, between exposing the first precursor 205 and the second precursor 215, the material deposition process 200 may include introducing ammonia (e.g., a gaseous phase of ammonia) into the reactor and exposed to the compound 220, the compound 230, or both. Additionally, or alternatively, introducing the ammonia and introducing the compound 230 may at least partially overlap in time. For example, the ammonia and the selenium compound may be co-flowed (e.g., flowed into the chamber) simultaneously. In some cases, such a step may be followed by removing the excess ammonia, selenium compound, and reaction byproducts using, for example, an evacuation, and argon purge, or a combination thereof. Introducing ammonia to the material deposition process 200 may support increased reactivity between the first precursor 205 and the second precursor 215, which may result in an increased growth rate of the layer 210, the compound 220, the compound 230, or a combination thereof for each cycle of the material deposition process 200 at various temperatures.

In some examples, the term 'alkyl' may refer to a saturated hydrocarbon chain, an unsaturated hydrocarbon chain, a linear hydrocarbon chain, a branched hydrocarbon chain, or a cyclic hydrocarbon chain including from one carbon atom (e.g., $C_1$) to ten carbon atoms (e.g., $C_{10}$). In some examples, an alkyl group may refer to a compound with a chemical formula $C_nH_{(2n+1)}$ where n is an integer greater than or equal to 1.

In some examples, the methods or aspects of the methods described herein may be performed using CVD. For instance, the first precursor 205 may be deposited using CVD and the second precursor may react with the first compound 220 via the methods described herein, the first compound 220 may be formed with the first precursor 205 via the methods described herein and the second precursor 215 may be deposited onto the first compound 220 using CVD, or the first precursor 205 and the second precursor 215 may both be deposited using CVD.

Independently including or selecting from a set of elements and/or compounds may refer to a capability that a first element or compound may be substituted for another while still producing a precursor usable for forming a compound on a surface of a material.

It should be noted that there may be examples in which the second precursor 215 may react with the layer 210 to form a third compound. In some such examples, the first precursor 205 may react with the third compound to form a fourth compound. The process may be repeated and such that multiple layers of a germanium-based film may form.

While the second compound 230 may be formed by sequentially introducing and reacting the first precursor 205 and the second precursor 215 (e.g., in an ABAB . . . sequence), the precursors may be introduced in a different order than that described above (e.g., in a BABA . . . sequence, an AABAAB . . . sequence, an ABBABB sequence) depending on the composition of the second compound 230. For instance, first precursor 205 may be introduced followed by the introduction of the second precursor 215. Depending on the composition of the second compound 230, more than one introduction (e.g., pulse) of the first precursor 205 or the second precursor 215 may be conducted before the second precursor 215 or the first precursor 205, respectively, are introduced.

In some examples, a first molecule for the first precursor 205 (e.g., precursor 1-*a*) and a second molecule for the second precursor 215 (e.g., precursor 2-*a*) may be introduced repeatedly for one or more cycles (e.g., AA times or AA cycles, where AA is some positive integer). After repeatedly introducing precursor 1-*a* and precursor 2-*a* over the multiple cycles, a third molecule for the first precursor 205 (e.g., precursor 1-*b*) and a fourth molecule for the second precursor (i.e., precursor 2-*b*) may be introduced repeatedly for one or more cycles (e.g., BB times or BB cycles, where BB is some positive integer). This process may continue for multiple other precursors up to a predefined amount (e.g., CC times or CC cycles for precursors 1-*c* and 2-*c*, DD times or DD cycles for precursors 1-*d* and 2-*d*, and so on, up to XX times or XX cycles for precursors 1-*x* and 2-*x*, where CC, DD, and XX may each be a positive integer). After this process continues up to the predefined amount, the process may repeat (e.g., precursors 1-*a* and 2-*a* may be used again for AA times or AA cycles). It should be noted that each of the molecules used as precursors for each cycle may be selected from the same molecule relative to a different cycle or different molecules from the molecules described herein for first precursor 205 and second precursor 215.

The methods described herein may have one or more advantages. For instance, the material deposition process 200 may occur at lower temperatures, relative to other deposition processes to form indium chalcogenide films. For example, the first precursor 205 reacting with the second precursor 215 (e.g., the indium compound reacting with the selenium compound, the indium compound reacting with the tellurium compound) may enable reactivity at temperatures between 90 degrees Celsius and 150 degrees Celsius. Alternatively, other methods to form indium chalcogenide films, such as PVD may occur at higher temperatures. Accordingly, forming an indium chalcogenide film using the material deposition process 200 may allow conformally depositing the indium chalcogenide film on or in high aspect-ratio structures. Such high aspect-ratio structures may be examples of various stages of memory system manufacturing, and forming the indium chalcogenide film may include depositing the indium chalcogenide film in recesses of the structure, for example as part of a memory cell material.

Figure 3:
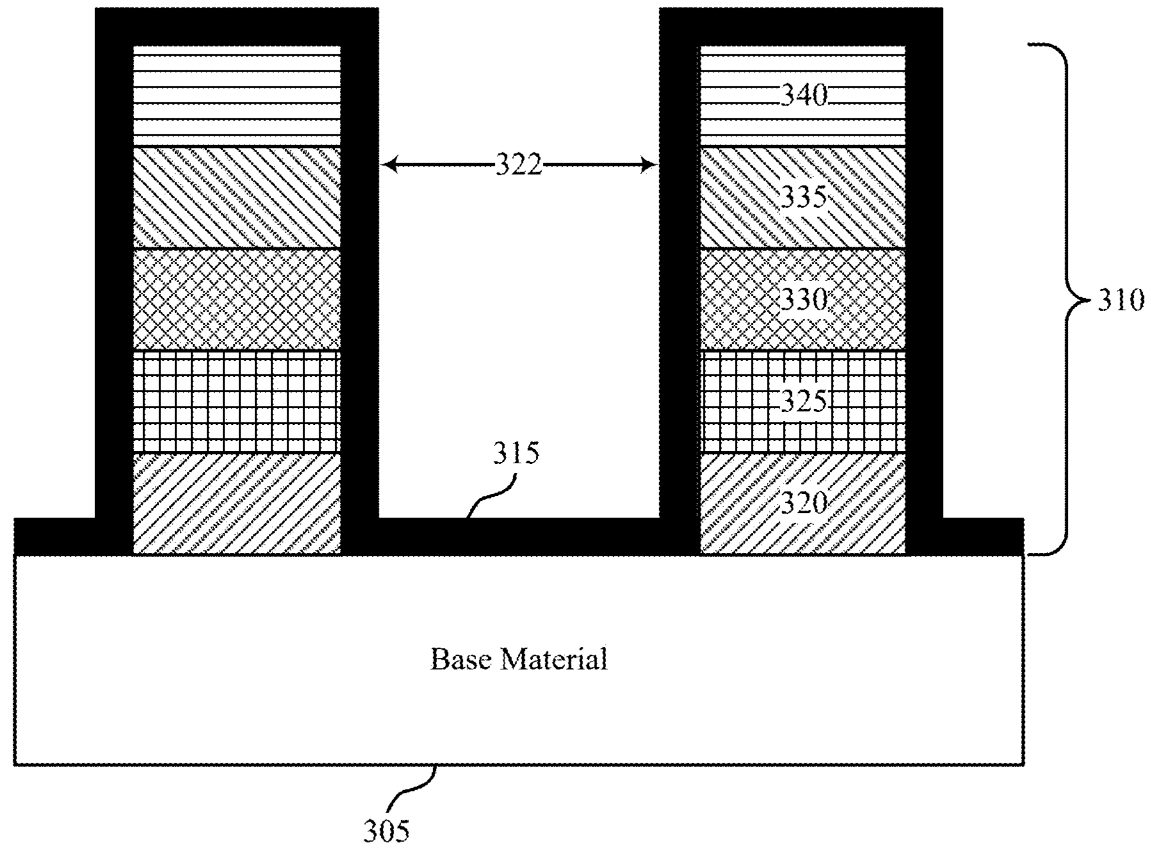
FIG. 3 shows an example of an electronic device that supports forming an indium chalcogenide film in accordance with examples as disclosed herein.

FIG. 3 shows an example of an electronic device 300 that supports methods for forming an indium chalcogenide film in accordance with examples as disclosed herein. The electronic device 300 may include a base material 305 with one or more features 310 (e.g., pillars, stacks), where the base material 305 and the one or more features 310 may be covered in a material 315. Each feature 310 may include materials 320, 325, 330, 335, and 340, where each of material 320, 325, 330, 335, and 340 may be an example of a chalcogenide material, an organic (e.g., carbon) material, a carbon allotrope (e.g., graphite), a reactive metal (e.g., tungsten, aluminum, or tantalum), a thermally-sensitive material, an oxidation-sensitive material, or any combination thereof. Some of material 320, 325, 330, 335, and 340 may be examples of other materials. In some examples, base material 305 or the combination of base material 305 and one or more features 310 may be an example of a base material 105 as described with reference to FIG. 1 or a layer 210 as described with reference to FIG. 2. Additionally or alternatively, material 315 may be an example of a second compound 125 as described with reference to FIG. 1 or a second compound 20 as described with reference to FIG. 2.

While FIG. 3 illustrates feature 310 including five materials, each feature may be made up of a single material or two or more materials. The features may be separated from each other by openings 322. The materials of the features 310 may be formed adjacent to (e.g., over) the base material 305 using techniques such as photolithography, physical vapor deposition (PVD), CVD, or ALD. In some examples, the base material 305 may include one or more materials, layers, structures, or regions thereon. The features 310 may be considered high aspect ratio (HAR) features, where HAR may for instance correspond to greater than or equal to an aspect ratio of 10:1, greater than or equal to an aspect ratio of 20:1, greater than or equal to an aspect ratio of 25:1, or greater than or equal to an aspect ratio of 50:1. In some examples, the material 315 may be formed on one of but not both base material 305 and the one or more features 310. Additionally or alternatively, the material 315 may be formed as a material within each of the one or more features 310. Additionally or alternatively, the material 315 may be formed on a planar material or on low aspect ratio features of an electronic device.

The material 315 may be formed over the features 310 according to the aspects described herein. For instance, the material 315 may be formed by sequentially exposing the features 310 of the electronic device 300 to a first precursor (e.g., first precursor 205) and a second precursor (e.g., second precursor 215) as described herein. The material 315 may function as a conductive component of electronic device 300, such as a transistor, a capacitor, an electrode, an etch-stop material, a gate, a barrier material, or a spacer material. One or more materials and/or structure, such as a gate, may subsequently be formed in the openings 322 by techniques such as photolithography, PVD, CVD, or ALD and/or additional process acts conducted to form a complete electronic device containing electronic device 300.

The material 315 may be conformally formed on the features 310 according to the aspects described herein. For instance, the thickness of material 315 on sidewalls of the features 310 may be substantially uniform. For instance, the material 315 may be formed to a thickness ranging from a monolayer to 100 nm. Alternatively, the material 315 may be formed at a greater thickness. The material 315 may be in direct contact with each material of the features 310 or some materials of the features 310. Additionally or alternatively, the material 315 may be in contact with the base material 305.

In some examples, the base material 305 may be a structure on a substrate (e.g., a wafer). In some such examples, the base material 305 may span in a first direction and a second direction, where the first direction is orthogonal to the second direction. Additionally, a memory device including the base material 305 may include word lines extending along the first direction and/or the second direction and bit lines extending along a third direction orthogonal to the first direction and the second direction. In some such examples, a stack of materials (e.g., a sequence of materials, such as features 310) may be formed in one or more recesses of the word lines, where the stack may extend along the first direction and/or the second direction and where the sequence of materials may include a memory cell (e.g., a chalcogenide element). In some examples, the stacks may each be coupled with one word line and one bit line. In some examples, the techniques described herein may be used to form layers of indium chalcogenides on the base material 305, the word lines, the bit lines, the stacks, or any combination thereof.

In some examples, the indium chalcogenide material may be integrated within a memory cell. For example, the indium chalcogenide may be included in or may be a memory material for a memory cell. In such examples, the indium chalcogenide may be configured to store one or more logic states. Additionally, or alternatively, the indium chalcogenide material may be configured as part of a selector device or selector component of a memory cell. Such a memory cell may be implemented in multiple memory architectures, such as a vertical (e.g., three-dimensional) Not-And (NAND) memory device, and may be configured to be operated (e.g., selected by, written to, read from) using the word lines, the bit lines, or a combination thereof.

FIG. 4 shows a flowchart illustrating a method 400 that supports forming an indium chalcogenide film in accordance with examples as disclosed herein. The operations of method 400 may be implemented by a manufacturing system or its components as described herein. For example, the operations of method 400 may be performed by a manufacturing system as described with reference to FIGS. 1 through 3. In some examples, a manufacturing system may execute a set of instructions to control the functional elements of the device to perform the described functions. Additionally, or alternatively, the manufacturing system may perform aspects of the described functions using special-purpose hardware.

At 405, the method may include reacting an indium-cyclopentadienyl precursor and a second precursor including a selenium compound or a tellurium compound to form an indium chalcogenide, the indium-cyclopentadienyl compound including the chemical formula $In—C_5B_1B_2B_3B_4B_5$, where each of $B_1$, $B_2$, $B_3$, $B_4$, and $B_5$ are independently selected from hydrogen, deuterium, an alkyl group, an aryl group, a first moiety containing carbon, a second moiety containing silicon, a third moiety containing germanium, a fourth moiety containing tin, a fifth moiety including the chemical formula $—SiB_aB_bB_c$, a sixth moiety including the chemical formula $—GeB_aB_bB_c$, a seventh moiety including the chemical formula $—SnB_aB_bB_c$, an eighth moiety including the chemical formula $—CB_aB_bSiB_cB_dB_e$, a ninth moiety including the chemical formula $—CB_aB_bGeB_cB_dB_e$, or a tenth moiety including the chemical formula $—CB_aB_bSnB_cB_dB_e$, where each of Ba, $B_b$, $B_c$, $B_d$, and $B_e$ are independently selected from hydrogen, deuterium, an alkyl group, or an aryl group. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for reacting an indium-cyclopentadienyl precursor and a second precursor including a selenium compound or a tellurium compound to form an indium chalcogenide, the indium-cyclopentadienyl compound including the chemical formula $In—C_5B_1B_2B_3B_4B_5$, where each of $B_1$, $B_2$, $B_3$, $B_4$, and $B_5$ are independently selected from hydrogen, deuterium, an alkyl group, an aryl group, a first moiety containing carbon, a second moiety containing silicon, a third moiety containing germanium, a fourth moiety containing tin, a fifth moiety including the chemical formula $—SiB_aB_bB_c$, a sixth moiety including the chemical formula $—GeB_aB_bB_c$, a seventh moiety including the chemical formula $—SnB_aB_bB_c$, an eighth moiety including the chemical formula $—CB_aB_bSiB_cB_dB_e$, a ninth moiety including the chemical formula $—CB_aB_bGeB_cB_dB_e$, or a tenth moiety including the chemical formula $—CB_aB_bSnB_cB_dB_e$, where each of $B_a$, $B_b$, $B_c$, $B_d$, and $B_e$ are independently selected from hydrogen, deuterium, an alkyl group, or an aryl group. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

Aspect 2: The method, apparatus, or non-transitory computer-readable medium of aspect 1, where reacting the indium-cyclopentadienyl precursor and the second precursor includes forming the indium chalcogenide by atomic layer deposition.

Aspect 3: The method, apparatus, or non-transitory computer-readable medium of any of aspects 1 through 2, where reacting the indium-cyclopentadienyl precursor and the second precursor includes forming the indium chalcogenide by chemical vapor deposition.

Aspect 4: The method, apparatus, or non-transitory computer-readable medium of any of aspects 1 through 3, where reacting the indium-cyclopentadienyl precursor and the second precursor includes conformally forming the indium chalcogenide on a substrate.

Aspect 5: The method, apparatus, or non-transitory computer-readable medium of any of aspects 1 through 4, where the selenium compound includes the chemical formula $R_1R_2R_3A\text{-}Se—ZR_4R_5R_6$, wherein each of $R_1$, $R_2$, $R_3$, $R_4$, $R_5$, and $R_6$ are independently selected from a hydrogen, a deuterium, an alkyl group, or an aryl group, and where A and Z are independently selected from germanium, tin, or silicon Aspect 6: The method, apparatus, or non-transitory computer-readable medium of any of aspects 1 through 5, where the second precursor includes a selenium compound including the chemical formula $R_1R_2R_3A\text{-}Se—ZR_4R_5R_6$ and each of $R_1$, $R_2$, $R_3$, $R_4$, $R_5$, and $R_6$ are independently selected from a hydrogen, a deuterium, an alkyl group, or an aryl group, and where A and Z are independently selected from germanium, tin, or silicon.

Aspect 7: The method, apparatus, or non-transitory computer-readable medium of any of aspects 1 through 6, where the selenium compound includes the chemical formula $R_1R_2R_3A\text{-}Se—ZR_4R_5R_6$; each of $R_1$, $R_2$, $R_3$, $R_4$, $R_5$, and $R_6$ are independently selected from a $—SiR_aR_bR_c$ moiety, a $—GeR_aR_bR_c$ moiety, a $—SnR_aR_bR_c$ moiety, a $—CR_aR_bSiR_cR_dR_e$ moiety, a $—CR_aR_bGeR_cR_dR_e$ moiety, or a $—CR_aR_bSnR_cR_dR_e$ moiety; and each of $R_a$, $R_b$, $R_c$, $R_d$, and $R_e$ are independently selected from a hydrogen, a deuterium, an alkyl group, or an aryl group, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

Aspect 8: The method, apparatus, or non-transitory computer-readable medium of any of aspects 1 through 7, where the tellurium compound includes the chemical formula $R_1R_2R_3A$-Te—$ZR_4R_5R_6$ and each of $R_1$, $R_2$, $R_3$, $R_4$, $R_5$, and $R_6$ are independently selected from a hydrogen, a deuterium, an alkyl group, or an aryl group, and where A and Z are independently selected from germanium, tin, or silicon.

Aspect 9: The method, apparatus, or non-transitory computer-readable medium of any of aspects 1 through 8, where the tellurium compound includes the chemical formula $R_1R_2R_3A$-Te—$ZR_4R_5R_6$ and each of $R_1$, $R_2$, $R_3$, $R_4$, $R_5$, and $R_6$ are independently selected from an eleventh moiety containing carbon, a twelfth moiety containing silicon, a thirteenth moiety containing germanium, a fourteenth moiety containing tin, or a combination thereof, and where A and Z are independently selected from germanium, tin, or silicon.

Aspect 10: The method, apparatus, or non-transitory computer-readable medium of any of aspects 1 through 9, where the tellurium compound includes the chemical formula $R_1R_2R_3A$-Te—$ZR_4R_5R_6$; each of $R_1$, $R_2$, $R_3$, $R_4$, $R_5$, and $R_6$ are independently selected from a —$SiR_aR_bR_c$ moiety, a —$GeR_aR_bR_c$ moiety, a —$SnR_aR_bR_c$ moiety, a —$CR_aR_bSiR_cR_dR_e$ moiety, a —$CR_aR_bGeR_cR_dR_e$ moiety, or a —$CR_aR_bSnR_cR_dR_e$ moiety; and each of Ra, Rb, $R_c$, Rd, and $R_e$ are independently selected from a hydrogen, a deuterium, an alkyl group, or an aryl group, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

Figure 5:
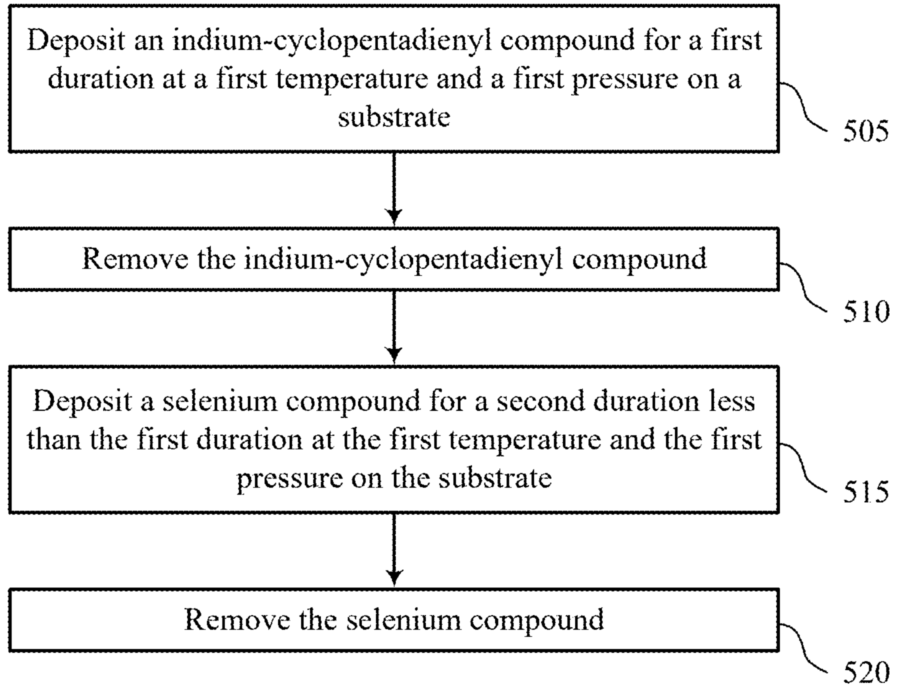

FIG. 5 shows a flowchart illustrating a method 500 that supports forming an indium chalcogenide film in accordance with examples as disclosed herein. The operations of method 500 may be implemented by a manufacturing system or its components as described herein. For example, the operations of method 500 may be performed by a manufacturing system as described with reference to FIGS. 1 through 3. In some examples, a manufacturing system may execute a set of instructions to control the functional elements of the device to perform the described functions. Additionally, or alternatively, the manufacturing system may perform aspects of the described functions using special-purpose hardware.

At 505, the method may include depositing an indium-cyclopentadienyl compound for a first duration at a first temperature and a first pressure on a substrate.

At 510, the method may include removing the indium-cyclopentadienyl compound.

At 515, the method may include depositing a second compound including a selenium compound or a tellurium compound for a second duration at the first temperature and the first pressure on the substrate.

At 520, the method may include removing the second compound.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for depositing an indium-cyclopentadienyl compound for a first duration at a first temperature and a first pressure on a substrate; removing the indium-cyclopentadienyl compound; depositing a second compound including a selenium compound or a tellurium compound for a second duration at the first temperature and the first pressure on the substrate; and removing the second compound.

Aspect 12: The method, apparatus, or non-transitory computer-readable medium of aspect 11, where the indium-cyclopentadienyl compound includes the chemical formula In—$C_5B_1B_2B_3B_4B_5$ and each of $B_1$, $B_2$, $B_3$, $B_4$, and $B_5$ are independently selected from a hydrogen, a deuterium, an alkyl group, or an aryl group.

Aspect 13: The method, apparatus, or non-transitory computer-readable medium of any of aspects 11 through 12, where the indium-cyclopentadienyl compound includes the chemical formula In—$C_5B_1B_2B_3B_4B_5$ and each of $B_1$, $B_2$, $B_3$, $B_4$, and $B_5$ are independently selected from a first moiety containing carbon, a second moiety containing silicon, a third moiety containing germanium, a fourth moiety containing tin, or a combination thereof.

Aspect 14: The method, apparatus, or non-transitory computer-readable medium of any of aspects 11 through 13, where the indium-cyclopentadienyl compound includes the chemical formula In—$C_5B_1B_2B_3B_4B_5$; each of $B_1$, $B_2$, $B_3$, $B_4$, and $B_5$ are independently selected from a —$SiB_aB_bB_c$ moiety, a —$GeB_aB_bB_c$ moiety, a —$SnB_aB_bB_c$ moiety, a —$CB_aB_bSiB_cB_dB_e$ moiety, a —$CB_aB_bGeB_cB_dB_e$ moiety, or a —$CB_aB_bSnB_cB_dB_e$ moiety; and each of $B_a$, $B_b$, $B_c$, $B_d$, and $B_e$ are independently selected from a hydrogen, a deuterium, an alkyl group, or an aryl group. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

Aspect 15: The method, apparatus, or non-transitory computer-readable medium of any of aspects 11 through 14, where the second compound includes the chemical formula $R_1R_2R_3A$-Se—$ZR_4R_5R_6$ and each of $R_1$, $R_2$, $R_3$, $R_4$, $R_5$, and $R_6$ are independently selected from a hydrogen, a deuterium, an alkyl group, or an aryl group, and where A and Z are independently selected from germanium, tin, or silicon.

Aspect 16: The method, apparatus, or non-transitory computer-readable medium of any of aspects 11 through 15, where the second compound includes the chemical formula $R_1R_2R_3A\text{-Se—}ZR_4R_5R_6$ and each of $R_1$, $R_2$, $R_3$, $R_4$, $R_5$, and $R_6$ are independently selected from a first moiety containing carbon, a second moiety containing silicon, a third moiety containing germanium, a fourth moiety containing tin, or a combination thereof, and where A and Z are independently selected from germanium, tin, or silicon.

Aspect 17: The method, apparatus, or non-transitory computer-readable medium of any of aspects 11 through 16, where the second compound includes the chemical formula $R_1R_2R_3A\text{-Se—}ZR_4R_5R_6$; each of $R_1$, $R_2$, $R_3$, $R_4$, $R_5$, and $R_6$ are independently selected from a $\text{—}SiR_aR_bR_c$ moiety, a $\text{—}GeR_aR_bR_c$ moiety, a $\text{—}SnR_aR_bR_c$ moiety, a $\text{—}CR_aR_b\text{-}SiR_cR_dR_e$ moiety, a $\text{—}CR_aR_bGeR_cR_dR_e$ moiety, or a $\text{—}CR_aR_bSnR_cR_dR_e$ moiety; and each of $R_a$, $R_b$, $R_c$, $R_d$, and $R_e$ are independently selected from a hydrogen, a deuterium, an alkyl group, or an aryl group, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

Aspect 18: The method, apparatus, or non-transitory computer-readable medium of any of aspects 11 through 17, where the second compound includes the chemical formula $R_1R_2R_3A\text{-te-}ZR_4R_5R_6$ and each of $R_1$, $R_2$, $R_3$, $R_4$, $R_5$, and $R_6$ are independently selected from a hydrogen, a deuterium, an alkyl group, or an aryl group, and where A and Z are independently selected from germanium, tin, or silicon.

Aspect 19: The method, apparatus, or non-transitory computer-readable medium of any of aspects 11 through 18, where the second compound includes the chemical formula $R_1R_2R_3A\text{-Te—}ZR_4R_5R_6$ and each of $R_1$, $R_2$, $R_3$, $R_4$, $R_5$, and $R_6$ are independently selected from a first moiety containing carbon, a second moiety containing silicon, a third moiety containing germanium, a fourth moiety containing tin, or a combination thereof, and where A and Z are independently selected from germanium, tin, or silicon.

Aspect 20: The method, apparatus, or non-transitory computer-readable medium of any of aspects 11 through 19, where the second compound includes the chemical formula $R_1R_2R_3A\text{-Te—}ZR_4R_5R_6$; each of $R_1$, $R_2$, $R_3$, $R_4$, $R_5$, and $R_6$ are independently selected from a $\text{—}SiR_aR_bR_c$ moiety, a $\text{—}GeR_aR_bR_c$ moiety, a $\text{—}SnR_aR_bR_c$ moiety, a $\text{—}CR_aR_b\text{-}SiR_cR_dR_e$ moiety, a $\text{—}CR_aR_bGeR_cR_dR_e$ moiety, or a $\text{—}CR_aR_bSnR_cR_dR_e$ moiety; and each of $R_a$, $R_b$, $R_c$, $R_d$, and $R_e$ are independently selected from a hydrogen, a deuterium, an alkyl group, or an aryl group, or more generally a moiety containing a set of carbon atoms, silicon atoms, germanium atoms, tin atoms, or any combination thereof. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set, or to corresponding substituents represented as $R_a$ through $R_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $R_a$ through $R_x$ substituents. Additionally, the set of carbon atoms, silicon atoms, germanium atoms, tin atoms, or any combination thereof may be linear, branched, or cyclic. In some examples, $R_a$ through $R_x$ may be independently selected from hydrogen, deuterium, an alkyl group, an aryl group, or a combination thereof.

Aspect 21: The method, apparatus, or non-transitory computer-readable medium of any of aspects 11 through 20, where the first temperature is between 90° C. and 150° C.

Aspect 22: The method, apparatus, or non-transitory computer-readable medium of any of aspects 11 through 21, where the first pressure is between 0.5 torr and 20 torr.

Aspect 23: The method, apparatus, or non-transitory computer-readable medium of any of aspects 11 through 22, where the first duration is less than or equal to 10 seconds and the second duration is less than or equal to 5 seconds.

Figure 6:
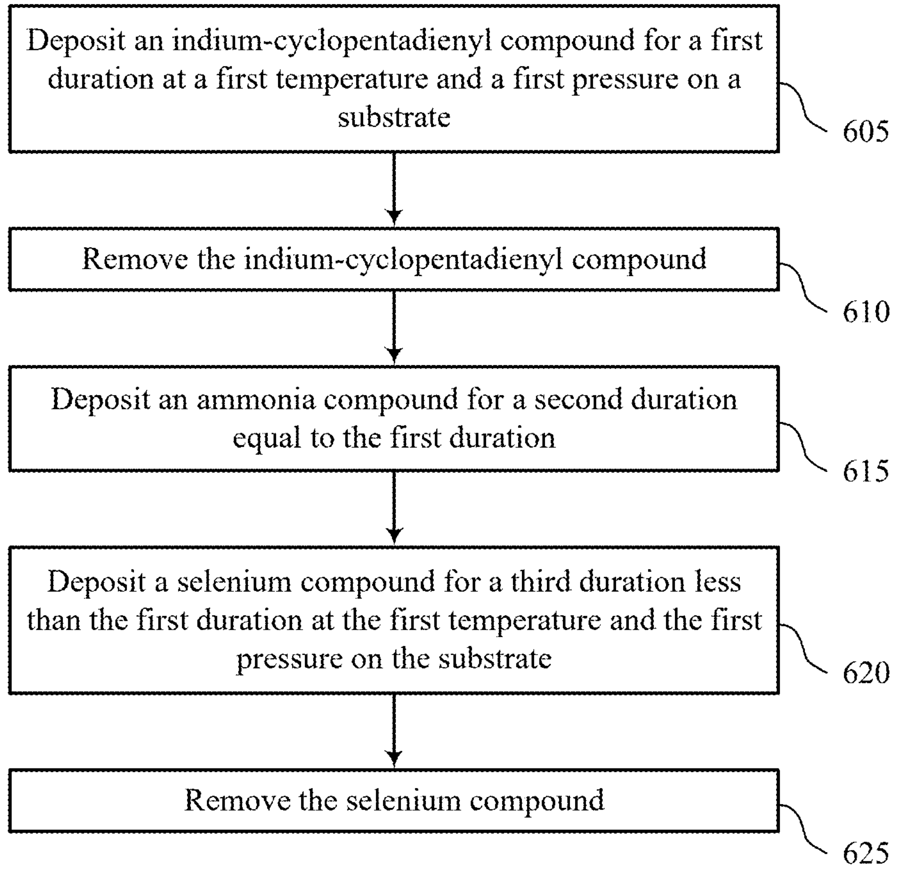

FIG. 6 shows a flowchart illustrating a method 600 that supports forming an indium chalcogenide film in accordance with examples as disclosed herein. The operations of method 600 may be implemented by a manufacturing system or its components as described herein. For example, the operations of method 600 may be performed by a manufacturing system as described with reference to FIGS. 1 through 3. In some examples, a manufacturing system may execute a set of instructions to control the functional elements of the device to perform the described functions. Additionally, or alternatively, the manufacturing system may perform aspects of the described functions using special-purpose hardware.

At 605, the method may include depositing an indium-cyclopentadienyl compound for a first duration at a first temperature and a first pressure on a substrate.

At 610, the method may include removing the indium-cyclopentadienyl compound.

At 615, the method may include depositing an ammonia compound for a second duration.

At 620, the method may include depositing a selenium compound for a third duration at the first temperature and the first pressure on the substrate.

At 625, the method may include removing the selenium compound.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 24: A method, apparatus, or non-transitory computer-readable medium including operations, features, circuitry, logic, means, or instructions, or any combination thereof for depositing an indium-cyclopentadienyl compound for a first duration at a first temperature and a first pressure on a substrate; removing the indium-cyclopentadienyl compound; depositing an ammonia compound for a second duration; depositing a selenium compound for a third duration at the first temperature and the first pressure on the substrate; and removing the selenium compound.

Aspect 25: The method, apparatus, or non-transitory computer-readable medium of aspect 24, where depositing the ammonia compound and depositing the selenium compound at least partially overlap in time.

Figure 7:
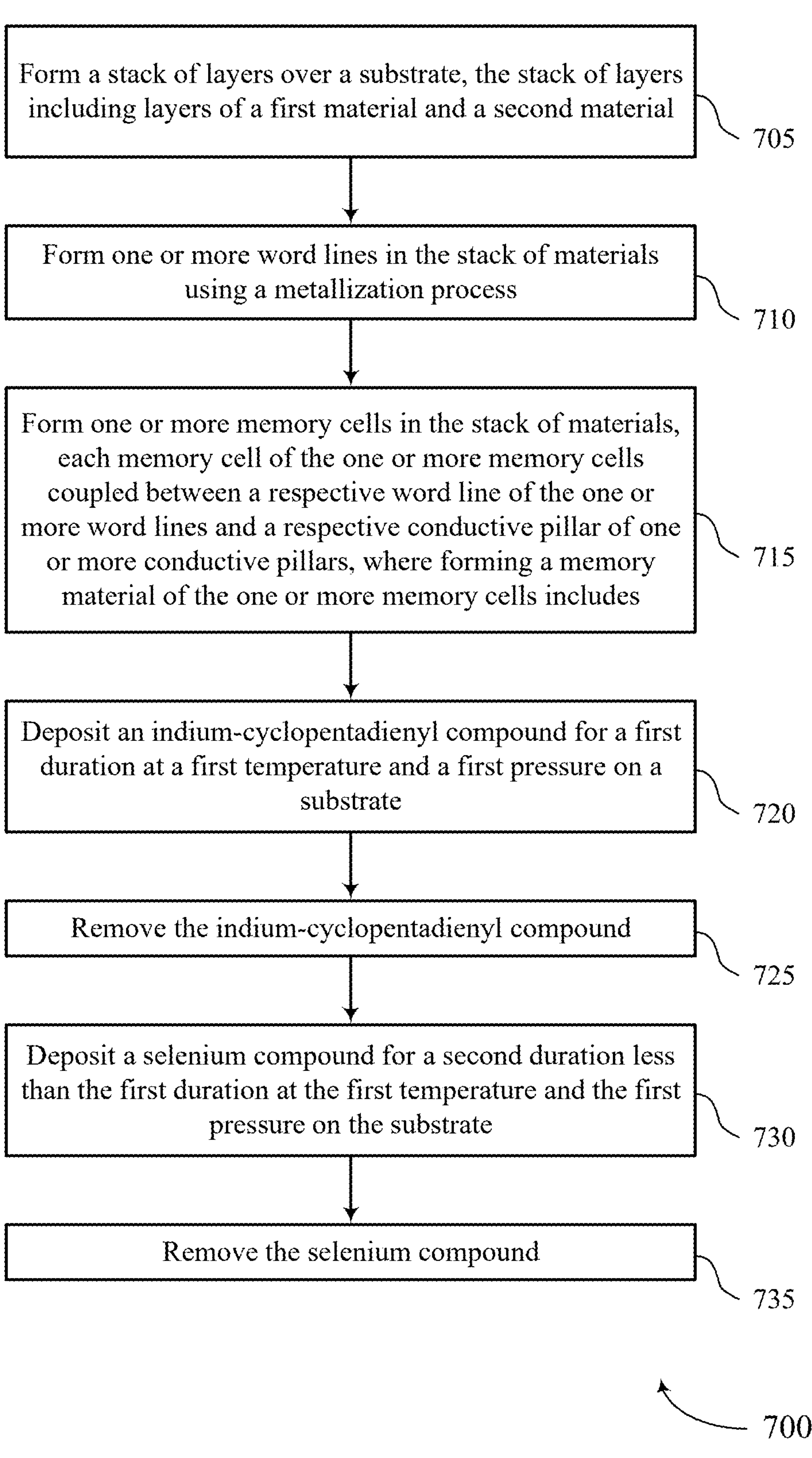

FIG. 7 shows a flowchart illustrating a method 700 that supports forming an indium chalcogenide film in accordance with examples as disclosed herein. The operations of method 700 may be implemented by a manufacturing system or its components as described herein. For example, the operations of method 700 may be performed by a manufacturing system as described with reference to FIGS. 1 through 3. In some examples, a manufacturing system may execute a set of instructions to control the functional elements of the device to perform the described functions. Additionally, or alternatively, the manufacturing system may perform aspects of the described functions using special-purpose hardware.

At 705, the method may include forming a stack of layers over a substrate, the stack of layers including layers of a first material and a second material.

At 710, the method may include forming one or more word lines in the stack of materials using a metallization process.

At 715, the method may include forming one or more memory cells in the stack of materials, each memory cell of the one or more memory cells coupled between a respective word line of the one or more word lines and a respective conductive pillar of one or more conductive pillars, where forming a memory material of the one or more memory cells includes.

At 720, the method may include depositing an indium-cyclopentadienyl compound for a first duration at a first temperature and a first pressure on a substrate.

At 725, the method may include removing the indium-cyclopentadienyl compound.

At 730, the method may include depositing a selenium compound for a second duration at the first temperature and the first pressure on the substrate.

At 735, the method may include removing the selenium compound.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 26: A method, apparatus, or non-transitory computer-readable medium including operations, features, circuitry, logic, means, or instructions, or any combination thereof for forming a stack of layers over a substrate, the stack of layers including layers of a first material and a second material; forming one or more word lines in the stack of materials using a metallization process; forming one or more memory cells in the stack of materials, each memory cell of the one or more memory cells coupled between a respective word line of the one or more word lines and a respective conductive pillar of one or more conductive pillars, where forming a memory material of the one or more memory cells includes; depositing an indium-cyclopentadienyl compound for a first duration at a first temperature and a first pressure on a substrate; removing the indium-cyclopentadienyl compound; depositing a selenium compound for a second duration at the first temperature and the first pressure on the substrate; and removing the selenium compound.

Aspect 27: The method, apparatus, or non-transitory computer-readable medium of aspect 26, where removing the indium-cyclopentadienyl compound includes purging using argon for a third duration equal to the first duration.

Aspect 28: The method, apparatus, or non-transitory computer-readable medium of any of aspects 26 through 27, where removing the selenium compound includes purging using argon for third duration equal to the second duration.

Aspect 29: The method, apparatus, or non-transitory computer-readable medium of any of aspects 26 through 28, where the indium-cyclopentadienyl compound includes the chemical formula $In—C_5B_1B_2B_3B_4B_5$ and each of $B_1$, $B_2$, $B_3$, $B_4$, and $B_5$ are independently selected from a hydrogen, a deuterium, an alkyl group, or an aryl group.

Aspect 30: The method, apparatus, or non-transitory computer-readable medium of any of aspects 26 through 29, where the indium-cyclopentadienyl compound includes the chemical formula $In—C_5B_1B_2B_3B_4B_5$, where each of $B_1$, $B_2$, $B_3$, $B_4$, and $B_5$ are independently selected from hydrogen, deuterium, an alkyl group, an aryl group, a first moiety containing carbon, a second moiety containing silicon, a third moiety containing germanium, a fourth moiety containing tin, a fifth moiety including the chemical formula $—SiB_aB_bB_c$, a sixth moiety including the chemical formula $—GeB_aB_bB_c$, a seventh moiety including the chemical formula $—SnB_aB_bB_c$, an eighth moiety including the chemical formula $—CB_aB_bSiB_cB_dB_e$, a ninth moiety including the chemical formula $—CB_aB_bGeB_cB_dB_e$, or a tenth moiety including the chemical formula $—CB_aB_bSnB_cB_dB_e$, where each of $B_a$, $B_b$, $B_c$, $B_d$, and $B_e$ are independently selected from hydrogen, deuterium, an alkyl group, or an aryl group. For example, each atom of the set of carbon atoms, silicon atoms, germanium atoms, tin atoms, or any combination thereof may be fully saturated with respective substituents so that each of these (carbon, silicon, germanium, or tin) atoms has 4 bonds, which may be to other (carbon, silicon, germanium, or tin) atoms of the set or to corresponding substituents represented as $B_a$ through $B_x$ (where the substituents may be indexed as a, b, c . . . , x, where x is some index different than a). In some such examples, up to 10 atoms of Carbon, Silicon, Germanium, or Tin may be included in the set that are distinct from any atoms of Carbon, Silicon, Germanium, or Tin of the $B_a$ through $B_x$ substituents. Additionally, the set of carbon atoms, silicon atoms, germanium atoms, tin atoms, or any combination thereof may be linear, branched, or cyclic. In some examples, $B_a$ through $B_x$ may be independently selected from hydrogen, deuterium, an alkyl group, an aryl group, or a combination thereof.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processing system (e.g., one or more processors, one or more controllers, control circuitry processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

reacting an indium-cyclopentadienyl precursor and a second precursor comprising a selenium compound or a tellurium compound to form an indium chalcogenide, the indium-cyclopentadienyl precursor comprising the chemical formula $In—C_5B_1B_2B_3B_4B_5$, wherein each of $B_1$, $B_2$, $B_3$, $B_4$, and $B_5$ are independently selected from:

hydrogen, deuterium, an alkyl group, an aryl group, a first moiety containing carbon, a second moiety containing silicon, a third moiety containing germanium, a fourth moiety containing tin, a fifth moiety comprising the chemical formula $—SiB_aB_bB_c$, a sixth moiety comprising the chemical formula $—GeB_aB_bB_c$, a seventh moiety comprising the chemical formula $—SnB_aB_bB_c$, an eighth moiety comprising the chemical formula $—CB_aB_bSiB_cB_dB_e$, a ninth moiety comprising the chemical formula $—CB_aB_bGeB_cB_dB_e$, or a tenth moiety comprising the chemical formula $—CB_aB_bSnB_cB_dB_e$, wherein each of $B_a$, $B_b$, $B_c$, $B_d$, and $B_e$ are independently selected from hydrogen, deuterium, an alkyl group, or an aryl group.

2. The method of claim 1, wherein reacting the indium-cyclopentadienyl precursor and the second precursor comprises forming the indium chalcogenide by atomic layer deposition.

3. The method of claim 1, wherein reacting the indium-cyclopentadienyl precursor and the second precursor comprises forming the indium chalcogenide by chemical vapor deposition.

4. The method of claim 1, wherein reacting the indium-cyclopentadienyl precursor and the second precursor comprises conformally forming the indium chalcogenide on a substrate.

5. The method of claim 1, wherein the selenium compound comprises the chemical formula R1R2R3A-Se-ZR4R5R6, wherein each of R1, R2, R3, R4, R5, and R6 are independently selected from a hydrogen, a deuterium, an alkyl group, or an aryl group, and where A and Z are independently selected from germanium, tin, or silicon.

6. The method of claim 1, wherein the second precursor comprises a selenium compound comprising the chemical formula R1R2R3A-Se-ZR4R5R6, wherein each of R1, R2, R3, R4, R5, and R6 are independently selected from a hydrogen, a deuterium, an alkyl group, or an aryl group, and where A and Z are independently selected from germanium, tin, or silicon.

7. The method of claim 1, wherein the selenium compound comprises the chemical formula R1R2R3A-Se-ZR4R5R6, wherein each of R1, R2, R3, R4, R5, and R6 are independently selected from a —SiRaRbRc moiety, a —GeRaRbRc moiety, a —SnRaRbRc moiety, a —CRaRb-SiRcRdRe moiety, a —CRaRbGeRcRdRe moiety, or a —CRaRbSnRcRdRe moiety, wherein each of Ra, Rb, Rc, Rd, and Re are independently selected from a hydrogen, a deuterium, an alkyl group, or an aryl group, and wherein A and Z are independently selected from germanium, tin, or silicon.

8. The method of claim 1, wherein the tellurium compound comprises the chemical formula R1R2R3A-Te-ZR4R5R6, wherein each of R1, R2, R3, R4, R5, and R6 are independently selected from a hydrogen, a deuterium, an alkyl group, or an aryl group, and wherein A and Z are independently selected from germanium, tin, or silicon.

9. The method of claim 1, wherein the tellurium compound comprises the chemical formula R1R2R3A-Te-ZR4R5R6, wherein each of R1, R2, R3, R4, R5, and R6 are independently selected from an eleventh moiety containing carbon, a twelfth moiety containing silicon, a thirteenth moiety containing germanium, a fourteenth moiety containing tin, or a combination thereof, and where A and Z are independently selected from germanium, tin, or silicon.

10. The method of claim 1, wherein the tellurium compound comprises the chemical formula R1R2R3A-Te-ZR4R5R6, wherein each of R1, R2, R3, R4, R5, and R6 are independently selected from a —SiRaRbRc moiety, a —GeRaRbRc moiety, a —SnRaRbRc moiety, a —CRaRb-SiRcRdRe moiety, a —CRaRbGeRcRdRe moiety, or a —CRaRbSnRcRdRe moiety, wherein each of Ra, Rb, Rc, Rd, and Re are independently selected from a hydrogen, a deuterium, an alkyl group, or an aryl group, and wherein A and Z are independently selected from germanium, tin, or silicon.

11. A method, comprising:

depositing an indium-cyclopentadienyl compound for a first duration at a first temperature and a first pressure on a substrate, wherein deposition of the indium-cyclopentadienyl compound forms a first compound;

removing at least a portion of the indium-cyclopentadienyl compound;

depositing a second compound comprising a selenium compound or a tellurium compound for a second duration at the first temperature and the first pressure on the substrate, wherein the second compound reacts with the first compound to form an indium chalcogenide; and removing the second compound.

12. The method of claim 11, wherein the indium-cyclopentadienyl compound comprises the chemical formula In—C5B1B2B3B4B5, wherein each of B1, B2, B3, B4, and B5 are independently selected from a hydrogen, a deuterium, an alkyl group, or an aryl group.

13. The method of claim 11, wherein the indium-cyclopentadienyl compound comprises the chemical formula In—C5B1B2B3B4B5, wherein each of B1, B2, B3, B4, and B5 are independently selected from a first moiety containing carbon, a second moiety containing silicon, a third moiety containing germanium, a fourth moiety containing tin, or a combination thereof.

14. The method of claim 11, wherein the indium-cyclopentadienyl compound comprises the chemical formula In—C5B1B2B3B4B5, wherein each of B1, B2, B3, B4, and B5 are independently selected from a —SiBaBbBc moiety, a —GeBaBbBc moiety, a —SnBaBbBc moiety, a —CBaBb-SiBcBdBe moiety, a —CBaBbGeBcBdBe moiety, or a —CBaBbSnBcBdBe moiety, wherein each of Ba, Bb, Bc, Bd, and Be are independently selected from a hydrogen, a deuterium, an alkyl group, or an aryl group.

15. The method of claim 11, wherein the second compound comprises the chemical formula R1R2R3A-Se-ZR4R5R6, wherein each of R1, R2, R3, R4, R5, and R6 are independently selected from a hydrogen, a deuterium, an alkyl group, or an aryl group, and where A and Z are independently selected from germanium, tin, or silicon.

16. The method of claim 11, wherein the second compound comprises the chemical formula R1R2R3A-Se-ZR4R5R6, wherein each of R1, R2, R3, R4, R5, and R6 are independently selected from a first moiety containing carbon, a second moiety containing silicon, a third moiety containing germanium, a fourth moiety containing tin, or a combination thereof, and where A and Z are independently selected from germanium, tin, or silicon.

17. The method of claim 11, wherein the second compound comprises the chemical formula R1R2R3A-Se-ZR4R5R6, wherein each of R1, R2, R3, R4, R5, and R6 are independently selected from a —SiRaRbRc moiety, a —GeRaRbRc moiety, a —SnRaRbRc moiety, a —CRaRb-SiRcRdRe moiety, a —CRaRbGeRcRdRe moiety, or a —CRaRbSnRcRdRe moiety, wherein each of Ra, Rb, Rc, Rd, and Re are independently selected from a hydrogen, a deuterium, an alkyl group, or an aryl group, and wherein A and Z are independently selected from germanium, tin, or silicon.

18. The method of claim 11, wherein the second compound comprises the chemical formula R1R2R3A-Te-ZR4R5R6, wherein each of R1, R2, R3, R4, R5, and R6 are independently selected from a hydrogen, a deuterium, an alkyl group, or an aryl group, and where A and Z are independently selected from germanium, tin, or silicon.

19. The method of claim 11, wherein the second compound comprises the chemical formula R1R2R3A-Te-ZR4R5R6, wherein each of R1, R2, R3, R4, R5, and R6 are independently selected from a first moiety containing carbon, a second moiety containing silicon, a third moiety containing germanium, a fourth moiety containing tin, or a combination thereof, and where A and Z are independently selected from germanium, tin, or silicon.

20. The method of claim 11, wherein the second compound comprises the chemical formula R1R2R3A-Te-ZR4R5R6, wherein each of R1, R2, R3, R4, R5, and R6 are independently selected from a —SiRaRbRc moiety, a —GeRaRbRc moiety, a —SnRaRbRc moiety, a —CRaRb-SiRcRdRe moiety, a —CRaRbGeRcRdRe moiety, or a —CRaRbSnRcRdRe moiety, wherein each of Ra, Rb, Rc, Rd, and Re are independently selected from a hydrogen, a deuterium, an alkyl group, or an aryl group, and wherein A and Z are independently selected from germanium, tin, or silicon.

21. The method of claim 11, wherein the first temperature is between 90° C. and 150° C.

22. The method of claim 11, wherein the first pressure is between 0.5 torr and 20 torr.

23. The method of claim 11, wherein the first duration is less than or equal to 10 seconds and the second duration is less than or equal to 5 seconds.

24. A method, comprising:

depositing an indium-cyclopentadienyl compound for a first duration at a first temperature and a first pressure on a substrate, wherein deposition of the indium-cyclopentadienyl compound forms a first compound;

removing at least a portion of the indium-cyclopentadienyl compound;

depositing an ammonia compound for a second duration;

depositing a selenium compound for a third duration at the first temperature and the first pressure on the substrate, wherein the selenium compound reacts with the first compound to form an indium chalcogenide; and removing the selenium compound.

25. The method of claim 24, wherein depositing the ammonia compound and depositing the selenium compound at least partially overlap in time.

26. A method, comprising:

forming a stack of layers over a substrate, the stack of layers comprising layers of a first material and a second material;

forming one or more word lines in the stack of layers using a metallization process, and forming one or more memory cells in the stack of layers, each memory cell of the one or more memory cells coupled between a respective word line of the one or more word lines and a respective conductive pillar of one or more conductive pillars, wherein forming a memory material of the one or more memory cells comprises:

depositing an indium-cyclopentadienyl compound for a first duration at a first temperature and a first pressure on a substrate, wherein deposition of the indium-cyclopentadienyl compound forms a first compound;

removing at least a portion of the indium-cyclopentadienyl compound;

depositing a selenium compound for a second duration at the first temperature and the first pressure on the substrate, wherein the selenium compound reacts with the first compound to form an indium chalcogenide; and removing the selenium compound.

27. The method of claim 26, wherein removing the indium-cyclopentadienyl compound comprises purging using argon for a third duration equal to the first duration.

28. The method of claim 26, wherein removing the selenium compound comprises purging using argon for a third duration equal to the second duration.

29. The method of claim 26, wherein the indium-cyclopentadienyl compound comprises the chemical formula In—C5B1B2B3B4B5, wherein each of B1, B2, B3, B4, and B5 are independently selected from a hydrogen, a deuterium, an alkyl group, or an aryl group.

30. The method of claim 26, wherein the indium-cyclopentadienyl compound comprises the chemical formula In—C5B1B2B3B4B5, wherein each of B1, B2, B3, B4, and B5 are independently selected from hydrogen, deuterium, an alkyl group, an aryl group, a first moiety containing carbon, a second moiety containing silicon, a third moiety containing germanium, a fourth moiety containing tin, a fifth moiety comprising the chemical formula —SiBaBbBc, a sixth moiety comprising the chemical formula —GeBaBbBc, a seventh moiety comprising the chemical formula —SnBaBbBc, an eighth moiety comprising the chemical formula —CBaBbSiBcBdBe, a ninth moiety comprising the chemical formula —CBaBbGeBcBdBe, or a tenth moiety comprising the chemical formula —CBaBbSnBcBdBe, wherein each of Ba, Bb, Bc, Bd, and Be are independently selected from hydrogen, deuterium, an alkyl group, or an aryl group.

* * * * *